United States Patent
Marvasti

(10) Patent No.: US 7,570,186 B2
(45) Date of Patent: Aug. 4, 2009

(54) A/D CONVERTERS BASED ON SIGMA DELTA MODULATORS AND ITERATIVE METHODS

(76) Inventor: Farokh Marvasti, Shrif University, Tehran (IR)

( * ) Notice: Subject to any disclaimer, the term of this patent is extended or adjusted under 35 U.S.C. 154(b) by 0 days.

(21) Appl. No.: 11/829,891

(22) Filed: Jul. 28, 2007

(65) Prior Publication Data

US 2009/0027249 A1    Jan. 29, 2009

(51) Int. Cl.
*H03M 3/00* (2006.01)
(52) U.S. Cl. ...................... 341/143; 341/155
(58) Field of Classification Search .................. 341/143, 341/155
See application file for complete search history.

(56) References Cited

U.S. PATENT DOCUMENTS

| | | | | |
|---|---|---|---|---|
| 5,781,137 A * | 7/1998 | Knudsen | ..................... | 341/118 |
| 6,393,070 B1 * | 5/2002 | Reber | ......................... | 375/340 |
| 6,573,666 B1 * | 6/2003 | Killat | ......................... | 315/291 |
| 6,842,129 B1 * | 1/2005 | Robinson | ..................... | 341/143 |
| 6,940,438 B2 * | 9/2005 | Koe et al. | ..................... | 341/143 |
| 7,088,147 B2 * | 8/2006 | Prasad et al. | .................. | 327/91 |
| 2003/0128143 A1 * | 7/2003 | Yap et al. | ..................... | 341/143 |
| 2004/0210801 A1 * | 10/2004 | Prasad et al. | ................ | 714/700 |

* cited by examiner

*Primary Examiner*—Jean B Jeanglaude
(74) *Attorney, Agent, or Firm*—Idesazane Aryan; Barry Choobin

(57) ABSTRACT

A system and method is provided to improve the performance of the sigma delta analog to digital converter (ADC). An input signal analog signal received though an input device is passed to a sigma delta modulator (SDM). The output of the modulator is passed through a low pass filter. An iterative algorithm and acceleration algorithm are applied to process the filter output signals to shape the noise components and to improve the performance of the sigma delta ADC. A distortion operator such as G operator, comprising of sigma delta modulator and multistage low pass filter (LPF) is used to suppress the shaped quantization noise.

14 Claims, 6 Drawing Sheets

Table 1. SNR versus Number of Iterations for the first order SDM with number of quantization bits (q=2) (a. OSR=16, FIR   b. OSR=16, IIR   c. OSR=32, FIR   d. OSR=32, IIR)

Table 2. SNR versus Number of Iterations for the second order SDM with different number of quantization bits (q=3, 5) for different low-pass filters and OSR=32
(a. q=3, FIR  b. q=3, IIR  c. q=5, FIR  d. q=5, IIR)

A/D CONVERTERS BASED ON SIGMA DELTA MODULATORS AND ITERATIVE METHODS

SPONSORSHIP STATEMENT

The present invention is sponsored by Iranian National Science foundation.

FIELD OF THE INVENTION

The present invention pertains in general to analog-to-digital converters, and more particularly relates to improving the performance of sigma delta analog-to-digital converters ("ADCs").

BACKGROUND OF THE INVENTION

Sigma delta modulators are well established for use in high resolution analog to digital conversion. Typically the filters in the sigma delta modulator have complex architectures and play important role in the resolution of these ADCs.

A block diagram of a first order sigma-delta modulator A/D system is shown in FIG. 1. The system consists of an analog sigma-delta modulator followed by a digital decimator. The modulator consists of an integrator, an internal A/D converter or quantizer, and a D/A converter (DAC) used in the feedback path. The process of noise shaping by the sigma-delta modulator can be viewed as pushing quantization noise power from the signal band to other frequencies. The modulator output is just a delayed version of the signal plus quantization noise that has been shaped. The modulator output can then be low-pass filtered to attenuate the out-of-band quantization noise and finally can be down sampled to the Nyquist rate.

Different Methods to Improve the Performance of Sigma-Delta ADCs

1-Over Sampling:

Over sampling reduces the quantization noise power in the signal band by spreading a fixed quantization noise power over a bandwidth much larger than the signal band. Disadvantages: this method is limited by the frequency constraint of sigma-delta ADCs. As an example for a signal with the bandwidth of W we have:

$$OSR \pounds \frac{f_{max}}{2w}$$

where fmax is the maximum frequency that can be supported by Sigma-Delta ADC.

2-Higher-order SDMs

Higher orders Sigma-Delta modulators provide more quantization noise suppression over the low frequency signal band, and more amplification of the noise outside the signal band. Hence more noise power is pushed outside the signal band.

To obtain a performance improvement, these converters require analog circuits that need to be more complex and precise than those used in the 1st order sigma-delta modulator.

3-Multi-bit SDMs

The converters using a multi-bit internal quantizer offer more resolution from the internal quantizer. The use of a multi-bit quantizer affects the power of quantization noise in the expressions for the SNR, where each additional bit used in the quantizer will yield a 6 dB improvement in the SNR.

The main disadvantage is that the multi-bit DAC cannot be easily fabricated in VLSI with sufficient linearity needed for high resolution conversion. In addition, the multi-bit output also complicates the digital low-pass filter hardware following the modulator, because for multi-bit processing, the filter requires multi-bit hardware multipliers.

The previous methods were working more on some changes in the architecture of SDM ADCs to improve the performance of these ADCs, while the present invention proposes a method for applying a mathematical signal processing algorithm to improve the performance of these ADCs.

Therefore, it would advantageous to have a method and system that applies a mathematical signal processing algorithm to improve the performance of these ADCs.

SUMMARY OF THE INVENTION

The present invention is particularly directed to improve the performance of the sigma delta ADCs consisting sigma delta modulator and a simple low-pass filter by using iterative algorithm. The converter of the present invention generally requires the use of: a sigma delta modulator, a simple low-pass filter and an iterative block.

In present invention, the iterative algorithm is used to improve the performance of the Sigma-Delta ADCs where a G operator consists of the sigma-delta modulator and a simple and multi-stage low-pass filter used to suppress the shaped quantization noise.

BRIEF DESCRIPTION OF THE DRAWINGS

These and other objects and advantages of the present invention will become more apparent and more readily appreciated from the following description, taken in conjunction with the accompanying drawings of which.

DETAILED DESCRIPTION

Figure 1:
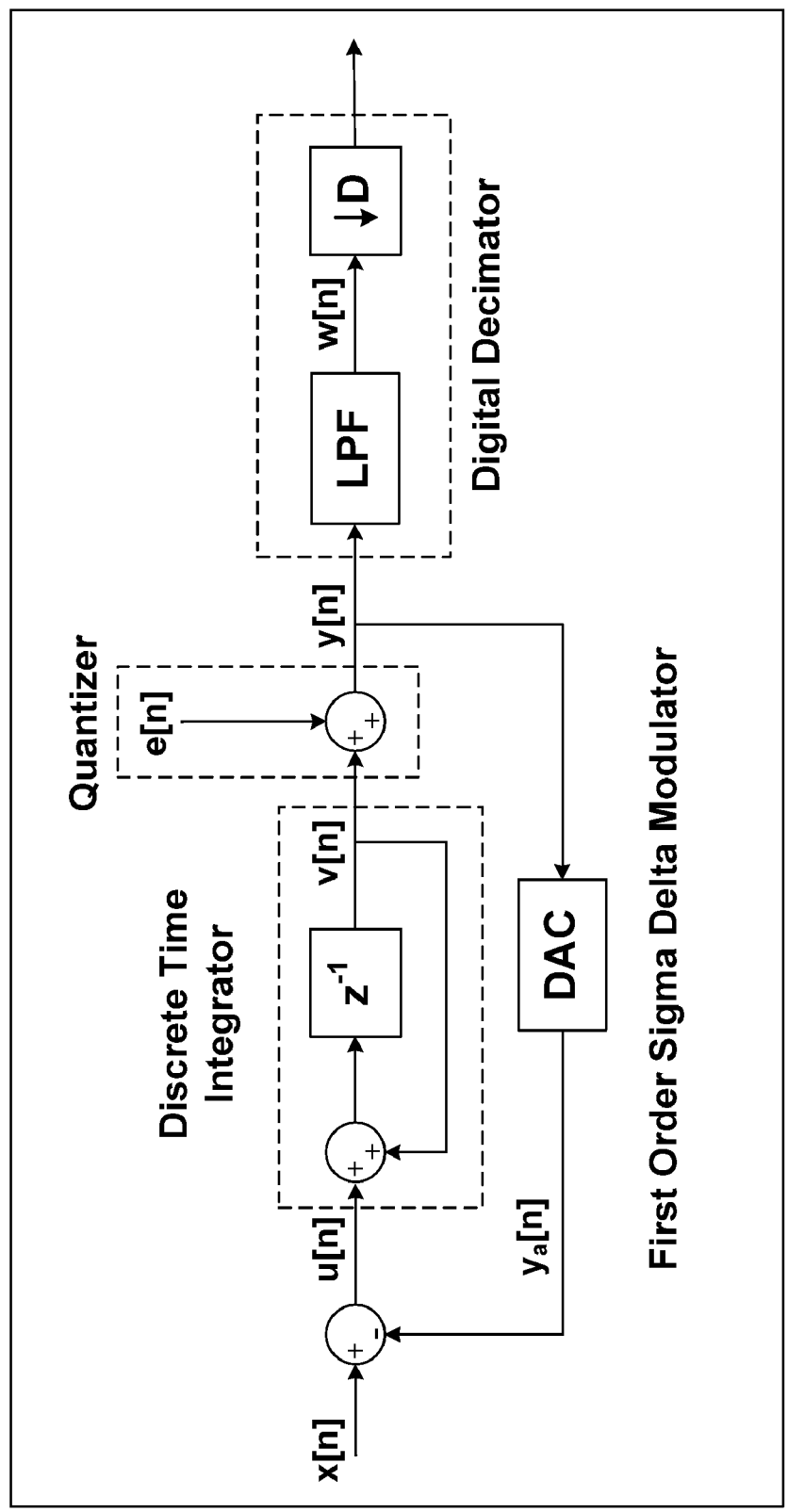
FIG. 1 is a block diagram of a first order sigma-delta modulator A/D system.

We implement our method using programmable logic devices (PLD), there are two main types of such devices:

FPGA: A field-programmable gate array is a kind of PLD containing programmable logic components called "logic blocks", and programmable interconnects.

CPLD: A complex programmable logic device is another kind of PLDs. The building block of a CPLD is the "macro cell", which contains logic implementing disjunctive normal form expressions and more specialized logic operations.

The primary differences between CPLDs and FPGAs are architectural. A CPLD has a somewhat restrictive structure consisting of one or more programmable sum-of-products logic arrays feeding a relatively small number of clocked registers. Another notable difference between CPLDs and FPGAs is the presence in most FPGAs of higher-level embedded functions (such as adders and multipliers) and embedded memories.

In the proposed method both low-pass filter and iterative block are programmed on FPGA/CPLD and they are implemented digitally, so this method introduces less complexity in analog parts of SDM ADCs and provides more flexibilities.

Some Practical Features of the Present Invention

The present invention proposes a method for applying a mathematical signal processing algorithm to improve the performance of these ADCs. The proposed method introduces less complexity in analog parts of SDM ADCs. For different SDMs (with different orders and quantization bits), the present invention does not require to change the architecture just needs to program the FPGA/CPLD based on the changes in SDM architecture. Different types of low-pass filters (FIR, IIR and FFT) are digitally implemented on the FPGA/CPLD.

Iterative Algorithms

1-The Iterative Method

The iterative algorithm is given by:

$$x_{k+1}(t) = \lambda G(t) + (I - \lambda G) x_k(t) \quad (13)$$

where $\lambda$ is the relaxation parameter that determines the convergence rate. $X_k(t)$ is the kth iteration and $x_0(t)$ can be any function of time. However, $x_0(t) = G\{x(t)\}$ can be a good choice to achieve faster convergence. In general, G can be either linear or non-linear operator. Defining the operators $\hat{G} = \lambda G$ and $E = I - \hat{G}$, we can rewrite (13)

$$x_{k+1} = \hat{G}x + (I - \hat{G})x_k \quad (14)$$

It is straightforward to show that (13) can be written as:

$$x_k(t) = (E^k + E^{k-1} + \ldots + E + I) x_0(t) \quad (15)$$

If G is a linear operator, we have:

$$E^k + E^{k-1} + \ldots + E + I = \frac{I - E^{k+1}}{I - E} \quad (16)$$

Figure 2:
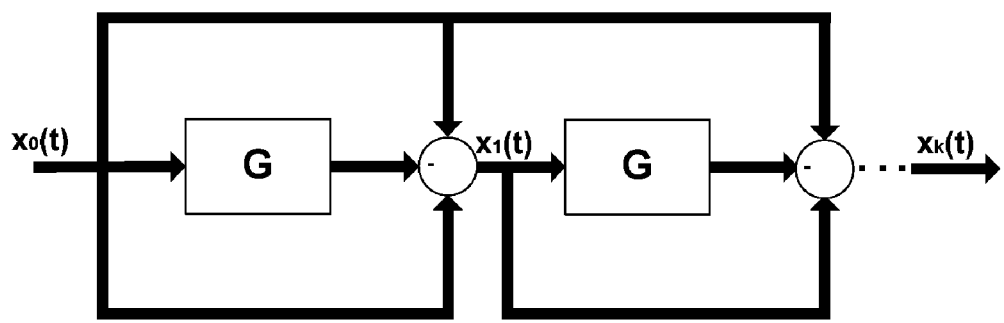
FIG. 2 is a block diagram of iterative algorithm.

If the norm of operator E satisfies $\|E\| < 1$, by increasing the number of iterations k, (13) approaches the inverse system $\hat{G}$; hence $x_k(t)$ converges to $x(t)$. The block diagram of this algorithm is shown in FIG. 2.

Figure 3:
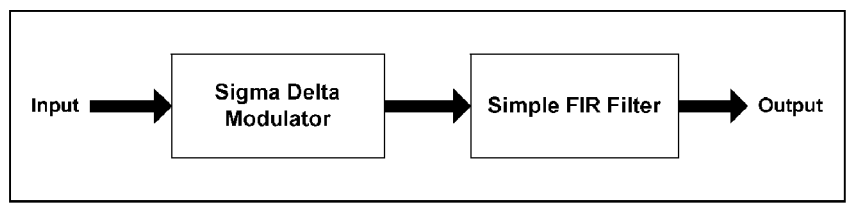
FIG. 3 is a block diagram of g operator in SDM ADCs.

In our approach, the iterative algorithm is used to improve the performance of the Sigma-Delta ADCs where the G operator consists of the sigma-delta modulator and a simple and multi-stage low-pass filter used to suppress the shaped quantization noise, as shown in FIG. 3.

2-The Acceleration Method

One of disadvantages of the conventional iterative method is its low convergence rate even for the optimum relaxation factor. The iterative method can be accelerated by utilizing the two previous iterations. The acceleration method is given by $$x_n = \left(x_1 + x_{n-1} - \frac{2}{A+B} G x_{n-1} - x_{n-2}\right) l_n + x_{n-2} \, n > 1$$

where $x_0 = \hat{x}$ and $x_1 = 2/(A+B)x_0$. G is the distortion operator defined in the preceding section. The constants A and B should be set properly for acceptable performance. There is no unique optimum pair of A and B, so they have to be selected by numerically. The parameter $\lambda n$ can be calculated as follows $$l_n = \left(1 - \frac{r^2}{4} l_{n-1}\right)^{-1} \quad (14)$$

where $\rho$ is defined as $$\rho = \frac{B - A}{B + A} \quad (15)$$

Figure 4:
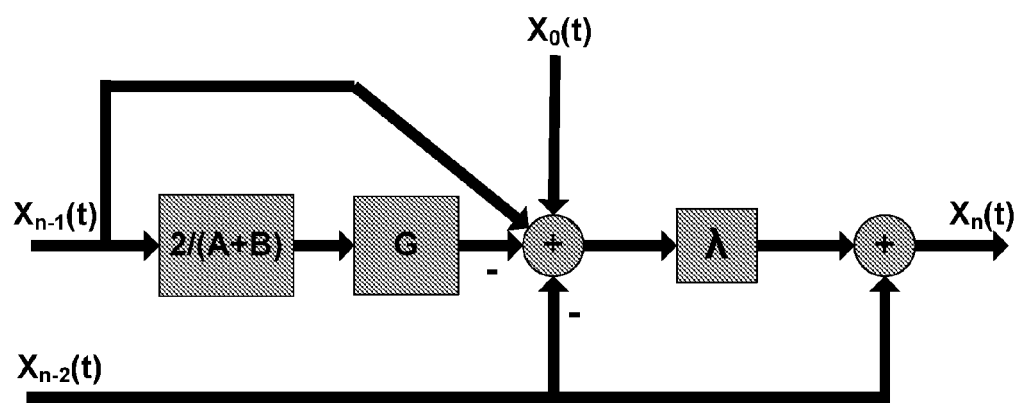
FIG. 4 is a block diagram of acceleration method.

The acceleration method improves the iterative method with a relatively small additional complexity. Here the parameter $\lambda n$ depends only on the constants A and B and can be calculated a priori. The block diagram of the acceleration algorithm is shown in FIG. 4. The G operator in this algorithm is the same as the one in the basic iterative algorithm:

Using Iterative Algorithms to Improve the Performance of SDM ADCS:

The simulation results for different types of Sigma-Delta ADCs in different OSRs are shown in below tables, as shown using the iterative algorithms improves the performance of all types of SDM ADCs.

The SNR of the reconstructed signal versus Number of Iterations has been depicted for the first order SDM with the fixed number of quantization bits (q=2). Two types of low-pass filters have been applied; the first one is a simple FIR filter which has 90 taps with hanning windowing and the other one is the first type IIR filtering with the order of 9. To show the effects of OSR the simulations have been done in OSR=16, 32.

Figure 5:
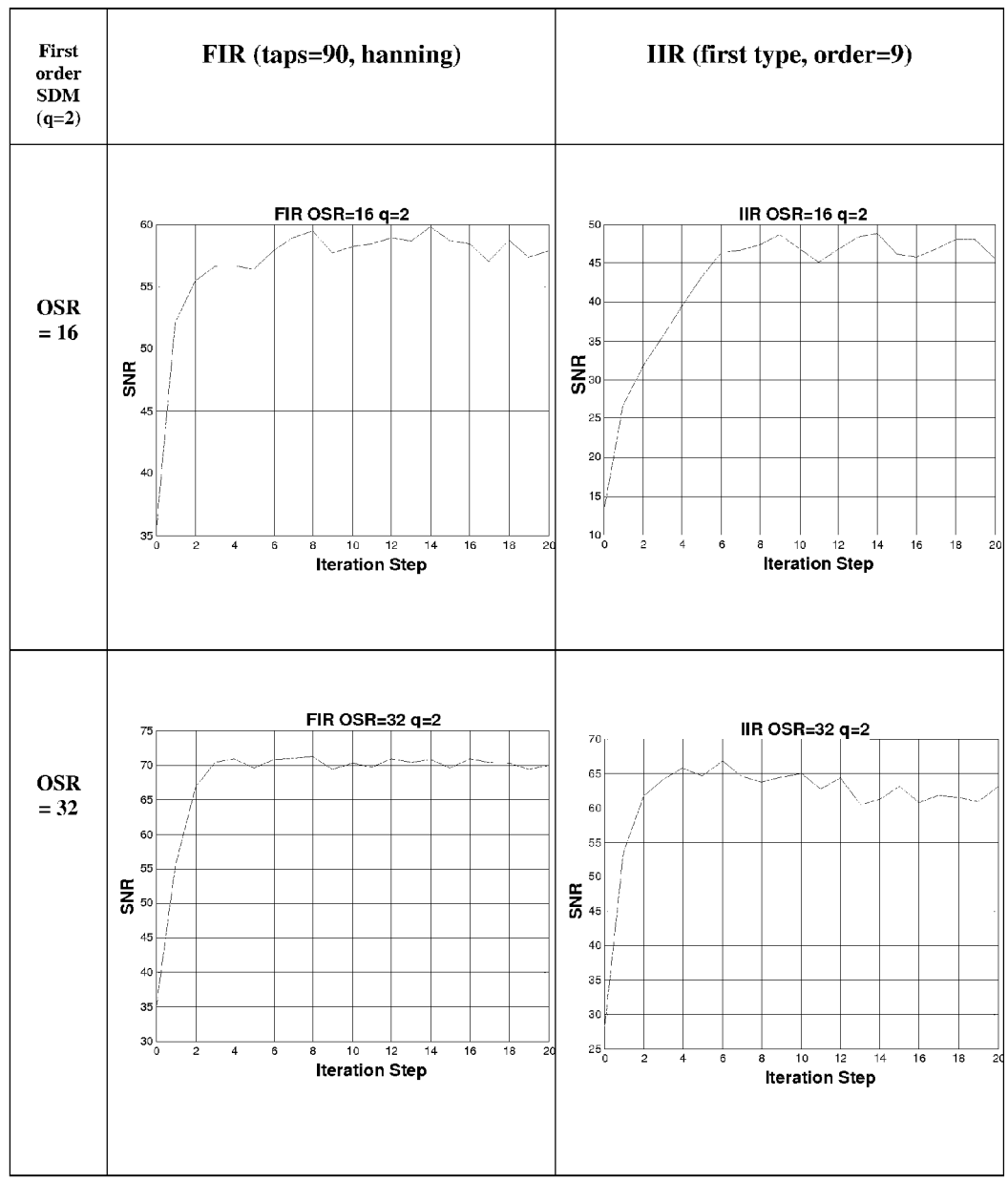
FIG. 5 is a table for illustration of SNR versus Number of Iterations for the first order. SDM with number of quantization bits (q=2) (a. OSR=16, FIR b. OSR=16, IIR c. OSR=32, FIR d. OSR=32, IIR).
Figure 6:
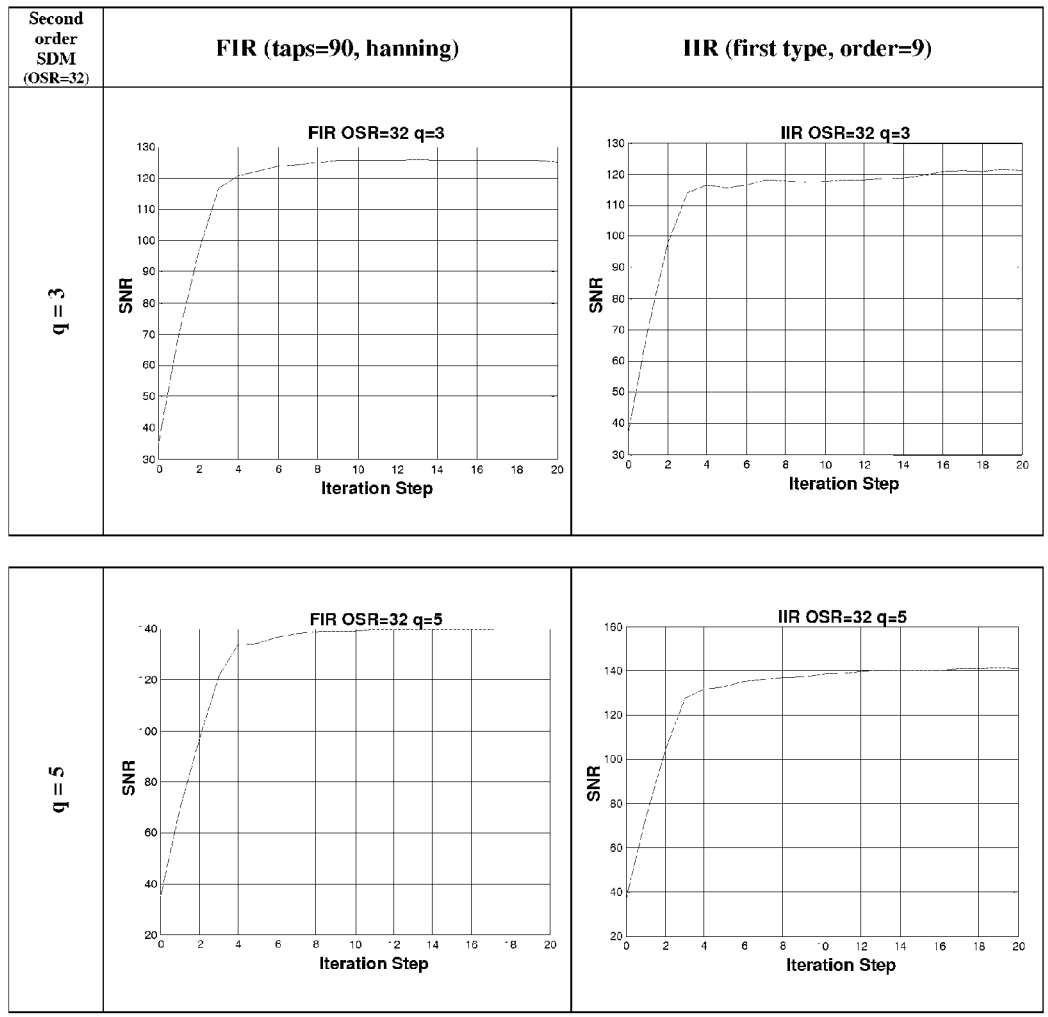
FIG. 6 is a table for illustration of SNR versus Number of Iterations for the second order SDM with different number of quantization bits (q=3, 5) for different low-pass filters and OSR=32 (a. q=3, FIR b. q=3, IIR c. q=5, FIR d. q=5, IIR).

As shown in FIGS. 5-6, using iterative algorithm improves the performance of Sigma-Delta ADCs with different types of low-pass filters and in different OSRs.

The SNR of the reconstructed signal versus Number of Iterations has been depicted for the second order SDMs with the two number of quantization bits (q=3, 5). Two types of low-pass filters have been applied; the first one is a simple FIR filter which has 90 taps with hanning windowing and the other one is the first type IIR filtering with the order of 9. As shown in simulation results, using iterative algorithm improves the performance of Sigma-Delta ADCs with different types of low-pass filters and number of quantization bits.

Using Acceleration Method to Improve the Performance of SDM ADCS:

The conventional sigma-delta ADCs with the complicated low-pass filters provide the SNR of 85 dB for the reconstructed signal where OSR=50 the proposed architecture using the basic iterative algorithm can reach up to the 155 dB just after 5 iterations. By the way using the acceleration algorithm can speed up the rate of convergence and with the same G operator a better performance is achievable just after the 4 iterations.

While the invention is described through the above examples, it will be understood by those of ordinary skill in the art that modification to and variation of the illustrated embodiment may be made without departing from the inventive concepts herein disclosed.

Accordingly, the invention should not be viewed as limited except by the scope and spirit of the appended claims.

What is claimed is:

1. A sigma-delta analog to digital converter based on iterative algorithm or acceleration algorithm comprising:
   an input for receiving analog signal;
   a means for sigma-delta modulation;
   a means for simple low pass filtering;
   a means for iterative processing comprising of at least two G operators wherein said two G operators comprised of a sigma-delta modulator followed by a simple low pass filter and an iterative algorithm for G operator in $k+1^{th}$ wherein said iterative algorithm for G is governed by $$x_{k+1}(t) = \lambda G x(t) + (I - \lambda G) x_k(t)$$

Where $\lambda$ is the relaxation parameter that determines convergence rate, $x_k(t)$ is the output signal in the $k^{th}$ iteration; and
   an output terminal.

2. A sigma-delta analog to digital converter based on iterative algorithm or acceleration algorithm as claimed in claim 1, wherein said converter is added as a block to the existing sigma delta modulators, without changing configuration of said existing sigma delta modulators, thereby improving performance of ADSc.

3. A sigma-delta analog to digital converter based on iterative algorithm or acceleration algorithm as claimed in claim 1, wherein said iterative algorithm or acceleration algorithm is implemented as a programmed CPLD/FPGA following existing sigma-delta modulators.

4. A sigma-delta analog to digital converter based on iterative algorithm or acceleration algorithm as claimed in claim 1, wherein said iterative algorithm or acceleration algorithm is applied for higher bandwidth signals in
   a frequency constrain on existing sigma delta modulators, thereby decreasing OSR of input signal and sampling higher bandwidth signal.

5. A sigma-delta analog to digital converter based on iterative algorithm or acceleration algorithm as claimed in claim 1, wherein said iterative algorithm or acceleration algorithm supports all types of sigma delta modulators with different orders.

6. A sigma-delta analog to digital converter based on iterative algorithm or acceleration algorithm as claimed in claim 1, wherein said iterative algorithm or acceleration algorithm supports all types of sigma delta modulators with different number of quantization bits.

7. A sigma-delta analog to digital converter based on iterative algorithm or acceleration algorithm as claimed in claim 1, wherein said iterative algorithm or acceleration algorithm supports all types of sigma delta modulators with different frequency ranges.

8. A sigma-delta analog to digital converter based on iterative algorithm or acceleration algorithm as claimed in claim 1, wherein said converter further comprises:
   a distortion operator G wherein said operator G consists of sigma delta modulator and a simple low pass filter wherein said simple lowpass filter suppresses shaped quantization noise.

9. A sigma-delta analog to digital converter based on iterative algorithm or acceleration algorithm as claimed in claim 1, wherein said low pass filter is implemented as a simple FIR filter and wherein number of taps in said low pass filter are substantially fewer than number of taps in existing sigma delta modulators ADCs.

10. A sigma-delta analog to digital converter based on iterative algorithm or acceleration algorithm as claimed in claim 9, wherein said FIR filter is implemented in a multi-stage configuration.

11. A sigma-delta analog to digital converter based on iterative algorithm or acceleration algorithm as claimed in claim 1, wherein said low pass filter is implemented as a low order IIR filter and wherein orders of said hR filter are substantially fewer than orders in existing sigma delta modulators ADCs.

12. A sigma-delta analog to digital converter based on iterative algorithm or acceleration algorithm as claimed in claim 1, wherein said low pass filter is implemented as a FFT filter.

13. A sigma-delta analog to digital converter based on iterative algorithm or acceleration algorithm as claimed in claim 1, wherein said iterative algorithm reaches to 155 dB after 5 iterations.

14. A sigma-delta analog to digital converter based on iterative algorithm or acceleration algorithm as claimed in claim 1, wherein said acceleration algorithm reaches to 155 dB after 4 iterations.

* * * * *